United States Patent [19]

Kan

[11] Patent Number: 5,102,981
[45] Date of Patent: Apr. 7, 1992

[54] IMIDE PREPOLYMER FROM BISIMIDE, DIAMINE AND TRIBROMOPHENYLMALEIMIDE

[75] Inventor: Kojiro Kan, Yamaguchi, Japan

[73] Assignee: Mitsui Petrochemical Industries Ltd., Tokyo, Japan

[21] Appl. No.: 598,281

[22] Filed: Oct. 16, 1990

[30] Foreign Application Priority Data

Oct. 18, 1989 [JP] Japan .................................. 1-271084

[51] Int. Cl.$^5$ .............................................. C08G 73/12
[52] U.S. Cl. ...................................... 528/322; 528/27; 528/28; 528/170; 528/321; 428/411.1; 428/473.5
[58] Field of Search ................. 528/322, 321, 170, 27, 528/28; 428/411.1, 473.5

[56] References Cited

FOREIGN PATENT DOCUMENTS 317216 5/1989 European Pat. Off. .
2053316 3/1987 Japan .................................. 526/262
01123831 6/1989 Japan .

*Primary Examiner*—Harold D. Anderson
*Attorney, Agent, or Firm*—Nixon & Vanderhye

[57] ABSTRACT

Imide prepolymers comprising unsaturated bisimides, diamines, and tribromophenylmaleimide in cured state show improved heat resistance, especially soldering heat resistance and flame retardance as well as mechanical properties and are suitable as laminates.

8 Claims, No Drawings

IMIDE PREPOLYMER FROM BISIMIDE, DIAMINE AND TRIBROMOPHENYLMALEIMIDE

This invention relates to novel imide prepolymers, and more particularly, to novel imide prepolymers having high heat resistance, especially soldering heat resistance, flame retardance, and low water absorption.

BACKGROUND OF THE INVENTION

Imide prepolymers are prepared through reaction between unsaturated bisimides such as N,N'-4,4'-diphenylmethanebismaleimide and diamines such as diaminodiphenylmethane by mixing them and heating the mixture or by heating them in high-boiling solvents such as N-methylpyrrolidone. These imide prepolymers are heat cured into products having high heat resistance and a low coefficient of thermal expansion. For these characteristics, the imide prepolymers have heretofore found major use as resins for multilayer printed circuit boards. Regretfully, cured products of these imide prepolymers are less flame retardant For example, laminates using the imide prepolymers fail to meet the flame retardance rating V-0 when subjected to a burning test according to UL-94.

In recent years, severe flame retardance requirements are imposed on electronic, automobile and other parts used in general living utilities for safety against fire. The resins which can be used in some areas have to meet the flame retardance requirement prescribed by laws or rules.

One typical method for imparting flame retardance to imide prepolymers is to modify imide prepolymers with brominated epoxy resins. Although this method is successful in imparting flame retardance, the modified prepolymers suffer from a marked loss of high-temperature properties, especially soldering heat resistance when molded into laminates. There is a need for heat resistant resins having high flame retardance and high-temperature properties in laminate form.

SUMMARY OF THE INVENTION

An object of the present invention is to eliminate the above-mentioned problems of the prior art techniques. Another object of the present invention is to provide a novel and improved imide prepolymers which have improved flame retardance, heat resistance, especially heat resistance upon soldering when formed into laminates, and low water absorption.

The inventors have found that by copolymerizing unsaturated bisimides and diamines with tribromophenylmaleimide to form imide prepolymers, high flame retardance can be imparted to cured products without detracting from heat resistance, especially soldering heat resistance in laminate form.

According to the present invention, there is provided an imide prepolymer comprising at least (i) an unsaturated bisimide of the formula:

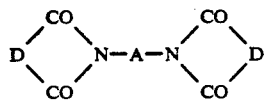 (I)

wherein D is a divalent group having a carbon-to-carbon double bond and A is a divalent group having at least two carbon atoms, (ii) a diamine of the formula:

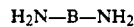 (II)

$H_2N-B-NH_2$ wherein B is a divalent group having up to 30 carbon atoms, and (iii) tribromophenylmaleimide. The imide prepolymer in cured state is also contemplated.

Preferably, the imide prepolymer is prepared by heating an unsaturated bisimide, a diamine and tribromophenylmaleimide as essential components.

Preferably, in the imide prepolymer, 3 to 30 parts by weight of the tribromophenylmaleimide is present per 100 parts by weight of the total of the unsaturated bisimide of formula (I) and the diamine of formula (II) The molar ratio of the unsaturated bisimide of formula (I) to the diamine of formula (II) ranges from 1.2 to 10. The preferred unsaturated bisimide is N,N'-4,4'-diphenylmethanebismaleimide and the preferred diamines are α,α'-bis(4-aminophenyl)-m-diisopropylbenzene and 4,4'-diaminodiphenylmethane.

DETAILED DESCRIPTION OF THE INVENTION

The imide prepolymers of the present invention are defined as comprising (i) an unsaturated bisimide, (ii) a diamine and (iii) tribromophenylmaleimide as essential components.

Component (i) is an unsaturated bisimide of the formula:

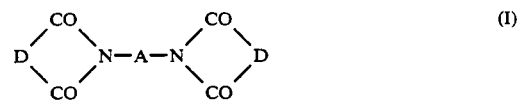 (I)

wherein D is a divalent group having a carbon-to-carbon double bond and A is a divalent group having at least two carbon atoms.

The group represented by A is not particularly limited as long as it is divalent and has at least two carbon atoms. Examples include linear and branched alkylene groups having 2 to 13 carbon atoms, 5- or 6-membered cyclic alkylene groups, heterocyclic groups containing at least one of O, N and S atoms, phenylene and fused ring aromatic hydrocarbon groups. These groups may have one or more substituents which do not give rise to undesired side reaction under reaction conditions.

Also included are two or more phenylene groups and alicyclic groups bonded through a valence bond, a divalent bond or a group selected from the class consisting of $-O-$, $-S-$, alkylene groups containing 1 to 3 carbon atoms, $-NR^4-$, $-P(O)R^3-$,

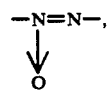

$-N=N-$, $-CO-O-$, $SO_2-$, $-SiR^3R^4-$, $-CONH-$, $-NY-CO-X-CO-NY-$, $-O-CO-X-CO-O$,

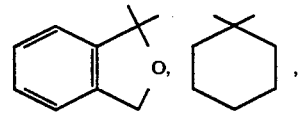

-continued

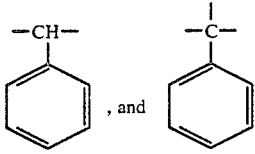, and

In the above formulae, $R^3$, $R^4$, and Y are independently selected from the class consisting of alkyl groups having 1 to 4 carbon atoms, 5- or 6-membered cyclic alkyl groups, phenyl and fused ring aromatic hydrocarbon groups, and X is selected from the class consisting of linear and branched alkylene groups having up to 13 carbon atoms, 5- or 6-membered cyclic alkylene groups, and monocyclic and polycyclic arylene groups.

Preferably A is the divalent group of the formula:

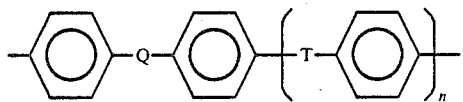

wherein n is 0-2, and Q and T are independently selected from a divalent bond and a group selected from the class consisting of —O—, —S—, alkylene groups containing 1 to 3 carbon atoms, —$NR^4$—, —P(O)$R^3$—,

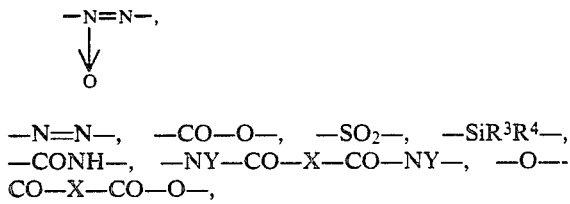

—N=N—, —CO—O—, —SO$_2$—, —Si$R^3R^4$—, —CONH—, —NY—CO—X—CO—NY—, —O—CO—X—CO—O—,

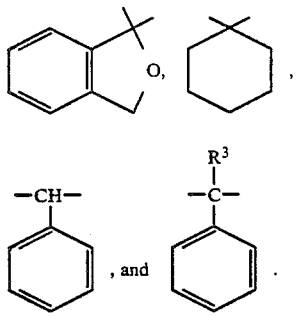, and

In the above formulae, $R^3$, $R^4$, and Y are independently selected from the class consisting of alkyl groups having 1 to 4 carbon atoms, 5- or 6-membered cyclic alkyl groups, phenyl and fused ring aromatic hydrocarbon groups, and X is selected from the class consisting of linear and branched alkylene groups having up to 13 carbon atoms, 5- or 6-membered cyclic alkylene groups, and monocyclic and polycyclic arylene groups.

In formula (I), D is a divalent group having a carbon-to-carbon double bond. The group represented by D is not particularly limited as long as it is divalent and has a carbon-to carbon double bond The preferred examples include

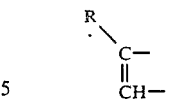

wherein R is hydrogen or a lower alkyl group,

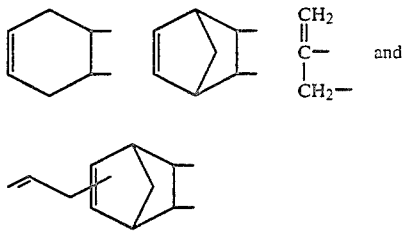

Several typical, non-limiting examples of the unsaturated bisimide of formula (I) include N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyletherbismaleimide, N,N'-3,4'-diphenyletherbismaleimide, N,N'-bismaleimide, N,N'-4,4'-diphenylsulfonebismaleimide, N,N'-m-xylenebismaleimide, α,α'-bis(N-4-maleimidephenyl)-m-diisopropylbenzene, α,α'-bis(N-4-maleimidephenyl)-p-diisopropylbenzene, N,N'-4,4'-cyclohexanebismaleimide, N,N'-4,4'-diphenylmethanebiscitraconimide, and mixtures thereof. Preferred among others are N,N'-4,4'-diphenylmethanebismaleimide, N,N'-m-phenylenebismaleimide, and N,N'-3,4'-diphenyletherbismaleimide.

Component (ii) is a diamine of the formula:

$$H_2N-B-NH_2 \quad (II)$$

wherein B is a divalent group having up to 30 carbon atoms, preferably 6 to 24 carbon atoms.

Examples of B are same as examples of A mentioned above. A and B may be same or different.

Several typical, non-limiting examples of the diamine of formula (II) include 4,4'-diaminocyclohexylmethane, 1,4'-diaminocyclohexane, m-phenylenediamine, p-phenylenediamine, 4,4'-diaminodiphenylmethane, 4,4'-diaminodiphenylether, 3,4'-diaminodiphenylether, 4,4'-diaminodiphenylsulfone, 4,4'-diaminodiphenyl sulfide, m-xylenediamine, p-xylenediamine, α,α'-bis(4-aminophenyl)-m-diisopropylbenzene, α,α'-bis(4-aminophenyl)-p-diisopropylbenzene, 1,3-bis(4-aminophenoxy)benzene, 1,4-bis(4-aminophenoxy)benzene, 2,2'-bis[4-(4-aminophenoxy)phenyl]propane, hexamethylenediamine, and mixtures thereof. Preferred among others are 4,4'-diaminodiphenylmethane, α,α'-bis(4-aminophenyl)-m-diisopropylbenzene, α,α'-bis(4-aminophenyl)-p-diisopropylbenzene, and mixtures thereof.

The molar ratio of the unsaturated bisimide of formula (I) to the diamine of formula (II) varies with a particular combination of unsaturated bisimide and diamine used, that is, depends on their chemical structure Imide prepolymers having better heat resistance and mechanical properties are obtained when the molar ratio I/II ranges from 1 2 to 10 Cured imide prepolymers having a better profile of heat resistance and mechanical properties are obtained when the ratio I/II ranges from 2 to 5.

In addition to the above-defined unsaturated bisimide and diamine, the imide prepolymers of the present invention further include (iii) tribromophenylmaleimide of the following formula

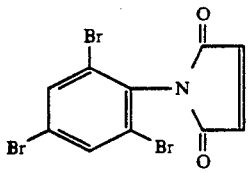

By virtue of essential inclusion of components (i), (ii) and (iii), the imide prepolymers of the present invention after curing exhibit improved flame retardance at no sacrifice of the heat resistance, especially soldering heat resistance in laminate form.

In the imide prepolymers of the invention, 3 to 30 parts by weight of tribromophenylmaleimide is preferably present per 100 parts by weight of the total of the unsaturated bisimide of formula (I) and the diamine of formula (II). For more desired additive benefits including flame retardance to exert, 3 parts by weight or more of tribromophenylmaleimide is necessary. The amount is limited to 30 parts by weight or less for avoiding a lowering of glass transition temperature and soldering heat resistance More preferably, tribromophenylmaleimide is added in an amount of 5 to 15 parts, and most preferably 5 to 10 parts by weight per 100 parts by weight of the total of the unsaturated bisimide of formula (I) and the diamine of formula (II) because the resulting imide prepolymers acquire flame retardance as rated V-0 when subjected to a burning test according to UL-94, and exhibit better soldering heat resistance and a high glass transition temperature.

The imide prepolymers of the invention may be synthesized from essential components (i), (ii) and (iii) by melt polymerizing these components, or by solution polymerizing these components in a non-protonic polar solvent such as N-methylpyrrolidone, dimethylacetamide, dimethylformamide, cresols such as m-cresol and p-cresol, and mixtures thereof. The polymerization temperature often ranges from about 60° C. to about 180° C. The order of addition of the three components during polymerization is not particularly limited.

The imide prepolymers thus obtained may be applied as varnish by dissolving them in such solvents as N-methyl-pyrrolidone, dimethylacetamide, dimethylformamide, m-cresol, p-cresol, and mixtures thereof, or cured, or further comminuted into a suitable form for compound use.

Alternatively, it is possible to synthesize a prepolymer by melt or solution polymerizing an unsaturated bisimide and a diamine, and add tribromophenylmaleimide to the prepolymer when the prepolymer is dissolved in the foregoing solvent to form a varnish.

In the synthesis of such prepolymers, any of various polymerization catalysts may be used if desired.

Preferably, an anionic polymerization catalyst may be used.

Examples of the anionic polymerization catalyst include imidazoles such as 2-methylimidazole, 2-ethyl-4-methylimidazole, 2-undecylimidazole, 2-phenylimidazole, 1-b and 1-cyanoethyl-2-ethyl-4-methylimidazole; and tertiary amines such as triethylamine and benzyldimethylamine. Imidazoles are preferred catalysts.

The catalyst may be used in an amount of 0.001 to 5% by weight, preferably 0.01 to 1% by weight based on the total of the unsaturated bisimide and the diamine.

The heat resistant, flame retardant imide prepolymers of the invention are preferably cured by heating at a temperature in the range of 170° to 250° C., preferably 180 to 220° C. for 10 to 180 minutes, preferably 10 to 120 minutes, and if desired, under pressure.

The thus obtained cured products are infusible, insoluble and least hygroscopic, and have a high glass transition temperature. When formed into laminates, the cured products have excellent soldering heat resistance.

The imide prepolymers of the invention can be used in various applications including IC encapsulants and adhesives by taking advantage of their heat resistance and flame retardance. They are especially suitable to form laminates for use as printed circuit boards because of soldering heat resistance, flame retardance and low water absorption.

Laminates are formed from the imide prepolymers by dissolving the prepolymer in such a solvent as N-methylpyrrolidone, dimethylacetamide, dimethylformamide, m-cresol, p-cresol, and mixtures thereof to form a varnish, and impregnating glass fabric therewith. The impregnated fabric is then dried at a temperature of 100° to 200° C. for 2 to 20 minutes, obtaining a prepreg. An appropriate number of prepreg sheets are stacked and compression molded at a temperature of 100° to 250° C. under a pressure of 10 to 50 kgf/cm$^2$ for 10 to 120 minutes, completing a laminate. The laminate is ready for use as such, but preferably after curing at a temperature of 180° to 250° C. for 2 to 48 hours.

It is also possible to formulate compositions by adding suitable additives such as lubricants, mold release agents, and coupling agents to the imide prepolymers of the invention.

Examples of the lubricant and mold release agent include carnauba wax, bees wax, rice wax, aliphatic amides such as ethylenebisstearylamide, fatty acids such as montanic acid and stearic acid and metals salts thereof, petroleum wax, polyethylene wax, polypropylene wax and oxidized products thereof, and silicone fluids such as polymethylsiloxane and polymethylphenylsiloxane.

Examples of the coupling agent include γ-glycidoxypropyltrimethoxysilane, and N-β-(aminoethyl)-α-aminopropyltrimethoxysilane.

Each of the lubricant, mold release agent, and coupling agent is preferably added in an amount of 0.1 to 5 parts by weight per 100 parts by weight of the total of components (i), (ii) and (iii).

If desired, reactive rubber components such as amine-terminated butadiene-acrylonitrile rubber (ATBN) and carboxyl-terminated butadiene-acrylonitrile rubber (CTBN), fluorinated resins such as Teflon ® (Du Pont), silicone resins, phenol resins, and aniline resins may be added to the imide prepolymers of the invention. These additives are preferably added in an amount of 10 to 200 parts by weight per 100 parts by weight of the total of components (i), (ii) and (iii).

Further, fillers including inorganic and organic fillers may also be added to the imide prepolymers of the invention, if desired. The useful fillers include silica powder, alumina powder, glass powder, mica, talc, barium sulfate, titanium oxide, molybdenum disulfide, aluminum powder, iron powder, copper powder, metal hydroxides such as aluminum hydroxide and magnesium hydroxide, balloons of silica, alumina, glass and phenol resins, and reinforcing fibers, for example, inorganic fibers such as glass fibers, alumina fibers, carbon fibers and silicon carbide fibers and aramide fibers such as Kevlar ® (Du Pont). These fillers are preferably added in an amount of 50 to 200 parts by weight per 100 parts by weight of the total of components (i), (ii) and (iii).

EXAMPLE

Examples of the present invention are given below by way of illustration and not by way of limitation. Percents are by weight.

EXAMPLE 1

A 500-ml separable flask was charged with 55 5 grams of α,α'-bis(4-aminophenyl)-m-diisopropylbenzene and dipped in an oil bath at 150° C. to melt the contents. With stirring, 144.5 grams of N,N'-4,4'-diphenylmethanebismaleimide and 22.0 grams of tribromophenylmaleimide were added to the flask over 2 minutes and stirring was further continued.

After 20 minutes from the start of addition of N,N'-4,4'-diphenylmethanebismaleimide, the reaction mixture was poured into a vat. The vat was placed in an air oven at 170° C. where the vat was heated for 20 minutes to effect further reaction.

At the end of reaction, the resulting prepolymer was cooled down to room temperature, comminuted, and dissolved in N-methylpyrrolidone to form a varnish having a resin concentration of 50%.

Glass cloth was impregnated with the varnish and dried in an oven at 160° C. for 7 minutes, obtaining a prepreg.

A copper clad laminate was prepared by stacking 9 plies of the prepreg one on another, placing a copper foil of one ounce on either surface of the stack, and compression molding the assembly at 180° C. under a pressure of 10 kgf/cm$^2$ for 60 minutes. The copper clad laminate was placed in an air oven at 200° C. where it was cured for 24 hours.

COMPARATIVE EXAMPLE 1

A copper clad laminate was prepared in the same procedure as in Example 1 except that 18.1 grams of a brominated epoxy resin (ETBA-100 manufactured by Nihon Kayaku K.K., Br content 48.1%) was used instead of the tribromophenylmaleimide.

EXAMPLE 2

A 500-ml separable flask was charged with 36.2 grams of diaminodiphenylmethane and dipped in an oil bath at 150° C. to melt the contents. With stirring, 163 8 grams of N,N'-4,4'-diphenylmethanebismaleimide and 15 grams of tribromophenylmaleimide were added to the flask over 2 minutes and stirring was further continued.

After 15 minutes from the start of addition of N,N'-4,4'-diphenylmethanebismaleimide, the reaction mixture was poured into a vat. The vat was placed in an air oven at 170° C. where the vat was heated for 16 minutes to effect further reaction.

At the end of reaction, the resulting prepolymer was cooled down to room temperature, comminuted, and dissolved in N-methylpyrrolidone to form a varnish having a resin concentration of 50%.

Glass cloth was impregnated with the varnish and dried in an oven at 160° C. for 7 minutes, obtaining a prepreg.

A copper clad laminate was prepared by stacking 9 plies of the prepreg one on another, placing a copper foil of one ounce on either surface of the stack, and compression molding the assembly at 180° C. under a pressure of 10 kgf/cm$^2$ for 60 minutes The copper clad laminate was placed in an air oven at 200° C. where it was cured for 24 hours.

The copper Clad laminate samples of examples were subjected to the following tests.

(1) Soldering Heat Resistance

The sample was heated in an oven at 300° C. for 5 minutes and then visually observed for any blisters or other defects on the surface.

(2) Water Absorption (D 1/100)

The sample was dipped in boiling distilled water at 100° C. for one hour to determine a water absorption.

(3) Tg

Glass transition temperature Tg was measured using a tester TMA-100 manufactured by Seiko Electronic K.K. Thermal expansion behavior was determined by heating the sample from room temperature to 300° C. at a rate of 10° C./min.

(4) Flame Retardance

A burning test according to UL94 was carried out to evaluate flame retardance according to the following criterion.

| | 94V-0 | 94V-1 | 94V-2 | 94HB |
|---|---|---|---|---|
| Average extinguishing time, sec. | ≦5 | ≦25 | ≦25 | Need not extinguish |
| Max. extinguishing time, sec. | ≦30 | ≦30 | ≦30 | burning rate ≦65 mm/min. |
| Total flaming time of 5 samples, sec. | ≦50 | ≦250 | ≦250 | — |
| Gauze burning* | NO | NO | Acceptable | — |
| Burning distance, mm | — | — | — | — |
| Sample direction | vert. | vert. | vert. | hor. |

*A piece of gauze is placed 30 cm below the sample and determined whether or not it is ignited with drips.

The results are shown in Table 1. The heading "Pretreatment" designates an environment in which the sample was placed prior to the test and is expressed according to the Japanese Industrial Standard (JIS) prescription. The symbol A designates that no pretreatment was carried out. The symbol D-1/100 designates that the sample had been dipped in boiling distilled water at 100° C. for one hour.

TABLE 1

| | Pretreatment | E1 | CE1 | E2 |
|---|---|---|---|---|
| Soldering | | | | |
| heat resistance | A | OK | Blisters | OK |
| @300° C./5 min. | D-1/100 | OK | Blisters | OK |
| Water absorption, % | D-1/100 | 0.12 | 0.16 | 0.14 |
| Tg, °C. | A | 231 | 235 | 240 |
| UL-94 | | V-0 | V-0 | V-0 |

As seen from Table 1, the imide prepolymers of the invention (Examples 1 and 2) have equivalent flame retardance and superior heat resistance and water absorption to the prior art imide prepolymer modified with a brominated epoxy resin (Comparative Example 1). The former shows outstandingly superior soldering heat resistance to the latter.

There has been described imide prepolymers comprising an unsaturated bisimide, a diamine and tribromophenylmaleimide which possess improved heat resistance, especially soldering heat resistance in laminate form, mechanical properties, and a high degree of flame retardance.

The imide prepolymers of the invention can be used in various applications including laminates for typical use as printed circuit boards as well as IC encapsulants, adhesives, and insulating varnish.

Although some preferred embodiments have been described, many modifications and variations may be made thereto in the light of the above teachings. It is therefore to be understood that within the scope of the appended claims, the invention may be practiced otherwise than as specifically described.

I claim:

1. An imide composition comprising
an unsaturated bisimide of the formula:

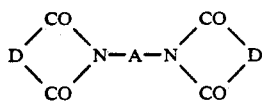

wherein D is a divalent group having a carbon-to-carbon double bond and A is a divalent group having at least two carbon atoms,
a diamine of the formula:

wherein B is a divalent group having up to 30 carbon atoms, and
tribromophenylmaleimide of the formula

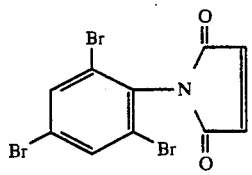

2. The imide composition of claim 1 wherein 3 to 30 parts by weight of the tribromophenylmaleimide is present per 100 parts by weight of the total of the unsaturated bisimide of formula (I) and the diamine of formula (II).

3. The imide composition of claim 1 wherein the molar ratio of the unsaturated bisimide of formula (I) to the diamine of formula (II) ranges from 1.2 to 10.

4. The imide composition of claim 1 wherein said unsaturated bisimide is N,N'-4,4'-diphenylmethanebismaleimide, and said diamine is at least one member selected from the group consisting of α,α'-bis(4-aminophenyl)-m-diisopropylbenzene and 4,4'-diaminodiphenylmethane.

5. A cured product of the imide composition of claim 1.

6. A cured product of the imide composition of claim 4.

7. A prepreg of the imide composition of claim 1 formed by a process comprising the steps of:
(a) dissolving the imide composition of claim 1 into a solvent to form a varnish,
(b) impregnating a reinforcement with the varnish, and
(c) drying the impregnated reinforcement to form the prepreg.

8. A process for preparing the imide composition of claim 1 by reacting said unsaturated bisimide, said diamine and tribromophenylmaleimide to form said imide composition.

* * * * *